United States Patent [19]

Kimbel et al.

[11] Patent Number: 5,593,498
[45] Date of Patent: Jan. 14, 1997

[54] APPARATUS FOR ROTATING A CRUCIBLE OF A CRYSTAL PULLING MACHINE

[75] Inventors: Steven L. Kimbel, St. Charles; Harold W. Korb, Town & Country; Cynthia F. Hall, St. Peters, all of Mo.

[73] Assignee: MEMC Electronic Materials, Inc., St. Peters, Mo.

[21] Appl. No.: 488,924

[22] Filed: Jun. 9, 1995

[51] Int. Cl.$^6$ .................................................. C30B 35/00
[52] U.S. Cl. .............................. 117/201; 117/18; 117/208
[58] Field of Search ............................. 117/13, 18, 200, 117/201, 208

[56] References Cited

U.S. PATENT DOCUMENTS

| | | | |
|---|---|---|---|
| 2,889,240 | 6/1959 | Rosi | 148/1.6 |
| 3,342,560 | 9/1967 | Eckardt et al. | 23/273 |
| 3,493,770 | 2/1970 | Dessauer et al. | 250/217 |
| 3,929,557 | 12/1975 | Goodrum . | |
| 4,040,895 | 8/1977 | Patrick et al. . | |
| 4,239,585 | 12/1980 | Köhl . | |
| 4,551,196 | 11/1985 | Capper et al. . | |
| 5,215,620 | 6/1993 | Kodama et al. . | |

FOREIGN PATENT DOCUMENTS

| | | |
|---|---|---|
| 0055619 | 7/1982 | European Pat. Off. . |
| 0098471 | 1/1984 | European Pat. Off. . |
| 0287156 | 6/1992 | European Pat. Off. . |
| 2328509 | 5/1977 | France . |
| 54-152683 | 12/1979 | Japan . |
| 59-156265 | 5/1984 | Japan . |
| 1519725 | 8/1978 | United Kingdom . |

OTHER PUBLICATIONS

H. J. Scheel et al., "Flux Growth of Large Crystals By Accelerated Crucible–Rotation Technique", Journal of Crystal Growth 8 (1971) pp. 304–306.

H. J. Scheel et al., "Crystal Pulling Using ACRT", Journal of Crystal Growth 49 (1980) pp. 291–296.

V. M. Masalov et al., "Hydodynamics and Oscillation of Temperature in Single Crystal Growth From High–Temperature Solutions With Use of ACRT", Journal of Crystal Growth 119 (1992) pp. 297–302.

Leybold–Heraeus GmbH, "Operating Instructions–Crystal Growth Furnace EKZ 2700 GV/CP/C/Si Cable Puller (with Microprocessor)", (pre–1994).

*Primary Examiner*—Nam Nguyen
*Assistant Examiner*—Felisa Garrett
*Attorney, Agent, or Firm*—Senniger, Powers, Leavitt & Roedel

[57] ABSTRACT

Apparatus and methods for pulling a semiconductor crystal according to a Czochralski method are disclosed. The apparatus includes a crucible containing a melt, a crystal pulling mechanism which pulls the semiconductor crystal from the melt, a motor coupled to the crucible, and a control circuit for energizing the motor to rotate the crucible at a variable speed. The control circuit may energize the motor to rotate the crucible at a continuously varying acceleration and continuously varying rotational speed while the crystal pulling mechanism is pulling at least a portion of the semiconductor crystal from the melt in the crucible. The control circuit may also energize the motor to rotate the crucible at a rotational speed which monotonically increases and decreases. A method for pulling a semiconductor crystal is also disclosed which includes the steps of performing a Fourier analysis on a periodic signal for variably rotating a crucible; generating a sine wave which corresponds to a fundamental Fourier frequency of the periodic signal; and energizing the crucible motor to rotate the crucible at a rotational speed which increases and decreases as a function of the generated sine wave. Other apparatus and methods for pulling crystals with the CZ method to achieve a desired oxygen concentration and gradient are also disclosed.

15 Claims, 3 Drawing Sheets

APPARATUS FOR ROTATING A CRUCIBLE OF A CRYSTAL PULLING MACHINE

BACKGROUND OF THE INVENTION

This invention relates generally to crystal pulling machines and more particularly to a method and apparatus for rotating a crucible of a crystal pulling machine.

The substantial majority of monocrystalline silicon used to make silicon wafers for the microelectronics industry is produced by crystal pulling machines employing the Czochralski method ("CZ method"). In brief, the CZ method uses a silicon melt formed by melting chunks of high-purity polycrystalline silicon in a quartz crucible in a furnace. A seed crystal is mounted from a crystal pulling mechanism above the silicon melt. The seed crystal is lowered by the crystal pulling mechanism into contact with the silicon melt. After the end of the seed is melted, the silicon melt is cooled until the crystal begins to grow. The crucible is rotated in one direction and the crystal is rotated in the opposite direction as the crystal is pulled from the melt. As the crystal grows, it solidifies silicon from the silicon melt in the crucible.

During the growing process, an oxygen diffusion boundary layer forms in the silicon melt near the crucible wall. This causes a certain level of oxygen to be present in the pulled crystal. When conventional crystal pulling techniques are used, an oxygen gradient forms radially in the crystal as well as along the length of the crystal.

In order to lessen the oxygen gradient in a grown crystal, the prior art teaches rotating the crucible in an on/off mode or with a pulsed square wave superimposed over a constant speed of rotation for the crucible. An example of the pulsed wave method is shown in U.S. Pat. No. 5,215,620 which superimposes a pulsed square wave over a constant reference speed of rotation for the crucible during the entire crystal pulling process. Although this increases the oxygen concentration in the back end of the silicon crystal rod, it also increases the oxygen concentration in the front end where increased oxygen only contributes to the axial oxygen gradient. Although these prior art methods reduce the oxygen gradient somewhat in a grown crystal, there is room for improvement. Further, these prior art methods cause unnecessary mechanical shock on the motor and drive train which rotate the crucible. Such mechanical shock causes a loss of energy in the motor and drive train and increases the wear rate for these components.

SUMMARY OF THE INVENTION

Among the objects of the present invention are to provide an improved apparatus and method for pulling a semiconductor crystal having a desired oxygen content and gradient; the provision of such apparatus and method for pulling a semiconductor crystal having a reduced radial oxygen gradient; the provision of such apparatus and method for pulling a semiconductor crystal having a reduced axial oxygen gradient; the provision of such apparatus and method for pulling a semiconductor crystal having an increased oxygen concentration; the provision of such apparatus and method which allow the rotational speed of the crucible containing the semiconductor melt to be varied smoothly and continually; the provision of such apparatus and method for rotating the crucible containing the semiconductor melt at varying rotational speeds with little mechanical shock on the drive mechanism; the provision of such apparatus and method which reduce maintenance and repair costs; and the provision of such apparatus and method which are reliable and easy to use.

Generally, apparatus of the present invention is constructed for pulling a semiconductor crystal according to a Czochralski method. The apparatus includes a crucible containing a melt, a crystal pulling mechanism which pulls the semiconductor crystal from the melt and a motor coupled to the crucible. A control circuit energizes the motor to rotate the crucible at a variable speed. The apparatus also includes a signal generator which generates a continuously varying speed signal. The control circuit energizes the motor as a function of the continuously varying speed signal to rotate the crucible at a continuously varying acceleration and continuously varying rotational speed while the crystal pulling mechanism is pulling at least a portion of the semiconductor crystal from the melt in the crucible.

In another aspect of the present invention, an apparatus is constructed for pulling a semiconductor crystal according to a Czochralski method. The apparatus includes a crucible containing a melt, a crystal pulling mechanism which pulls the semiconductor crystal from the melt and a motor coupled to the crucible. The apparatus also includes a control circuit which energizes the motor to rotate the crucible at a variable speed and a signal generator which generates a speed signal having a plurality of periods. The speed signal monotonically increases and decreases during each period. The control circuit energizes the motor to rotate the crucible at a rotational speed which monotonically increases and decreases as a function of the speed signal while the crystal pulling mechanism is pulling at least a portion of the semiconductor crystal from the melt in the crucible.

In another aspect of the present invention, a method of pulling a semiconductor crystal is performed so that the pulled semiconductor crystal has an oxygen concentration and gradient corresponding to an oxygen concentration and gradient in a crystal pulled using a variable crucible speed which speed varies as a function of a periodic signal. The method is for use with a semiconductor crystal puller having a crucible containing a melt, a crystal pulling mechanism which pulls the semiconductor crystal from the melt, and a motor coupled to the crucible which rotates the crucible at a variable speed. The method includes the steps of performing a Fourier analysis on the periodic signal, generating a sine wave which corresponds to a fundamental Fourier frequency of the periodic signal, energizing the motor to rotate the crucible at a rotational speed which increases and decreases as a function of the generated sine wave, and pulling at least a portion of the semiconductor crystal as the crucible rotates in response to the energizing step.

In still another aspect of the present invention, a method of pulling a single crystal silicon rod from a silicon melt contained within a crucible is performed. The single crystal silicon rod and the crucible are coaxial. The method includes the steps of rotating the crucible at a continuously varying acceleration and continuously varying rotational speed while at least a portion of the rod is being pulled from the melt and rotating the rod in a direction opposite to the direction of rotation of the crucible as the rod is grown.

In yet still another aspect of the present invention, a method of pulling a single crystal silicon rod from a silicon melt contained within a crucible is performed. The single crystal silicon rod and the crucible are coaxial. The method includes the steps of increasing a rotational speed of the crucible after a diameter of the rod is established until the rod has been pulled to a range of about twenty to about fifty percent of its final pull length, whereafter the rotational speed of the crucible reaches a reference speed; increasing and decreasing the rotational speed of the crucible above and below the reference speed following the increasing step until the rod has been pulled to within at least about twenty percent of its final pull length; and rotating the rod in a direction opposite to the direction of rotation of the crucible as the rod is grown.

Other objects and features will be in part apparent and in part pointed out hereinafter.

BRIEF DESCRIPTION OF THE DRAWINGS

Corresponding reference characters indicate corresponding parts throughout the several views of the drawings and disclosure.

DETAILED DESCRIPTION OF THE PREFERRED EMBODIMENT

Figure 1:
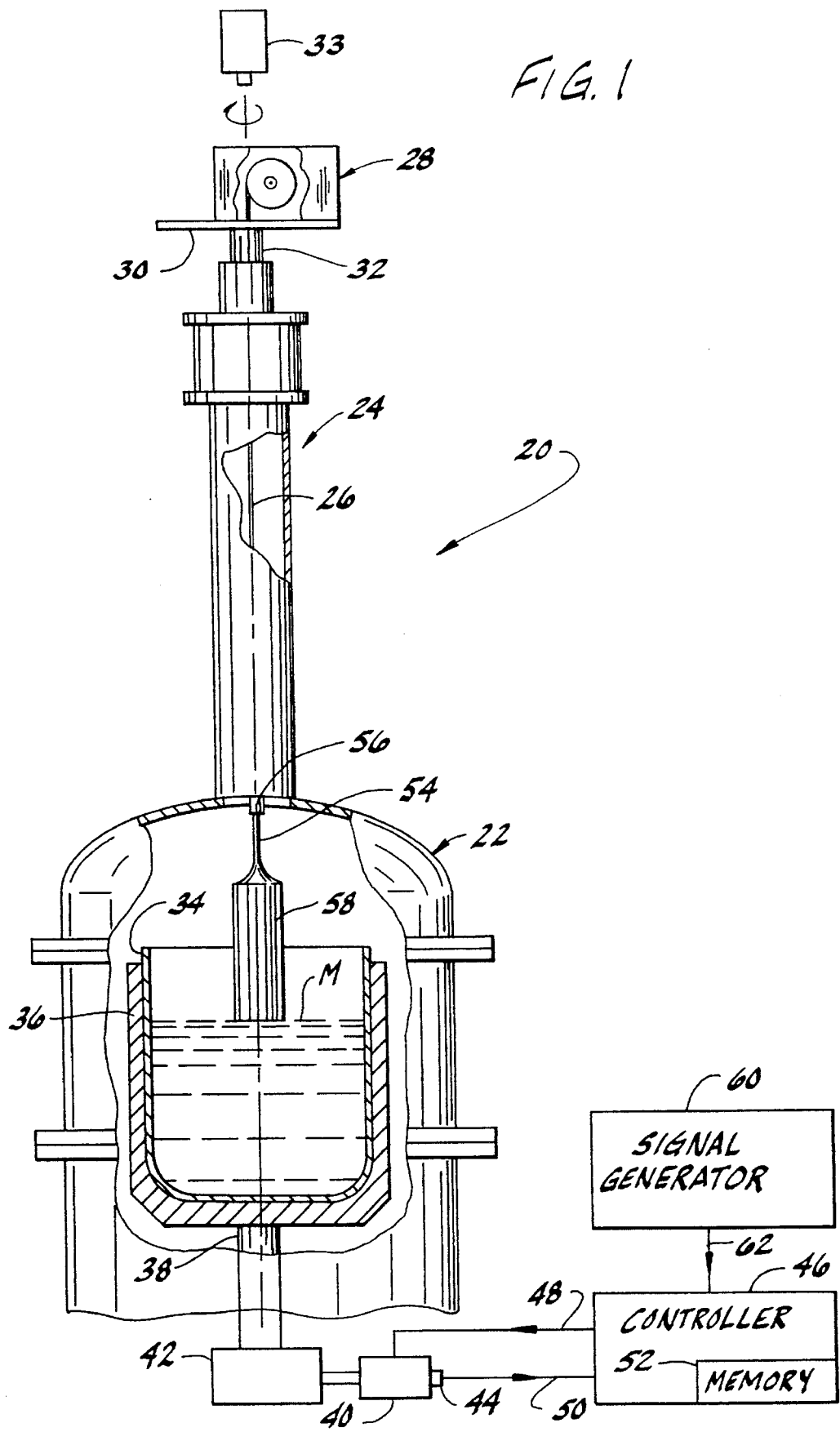
FIG. 1 is a schematic side elevational view of a crystal pulling machine having a crucible apparatus of this invention with portions of the machine broken away to show detail.

Referring now to FIG. 1, the basic components of a crystal pulling machine 20 for pulling single crystal silicon rods by the Czochralski method are shown. In particular, crystal pulling machine 20 includes a growth chamber 22 and an elongated pulling chamber 24 mounted above the growth chamber. A pull wire 26 is drawn in by a crystal lifting mechanism 28 to pull a single crystal silicon rod 58. Crystal lifting mechanism 28 is securely mounted on a plate 30 which is mounted on a rotatable shaft 32. A motor 33 is coupled to shaft 32 via suitable hardware (not shown) for rotating shaft 32, plate 30 and crystal lifting mechanism 28 relative to pulling chamber 24. Crystal rod 58 which is suspended from crystal lifting mechanism 28 can thereby be rotated in a given direction while it is being pulled.

Crystal pulling machine 20 also includes a crucible 34 in growth chamber 22 for holding a molten crystal source material M (e.g., a high-purity silicon melt). A cup-shaped turntable 36 is mounted on a shaft 38 for holding crucible 34. A motor 40 is coupled to shaft 38 via a gearbox 42 for rotating crucible 34 and turntable 36 at a variable speed.

Motor 40 includes a tachometer 44 which produces a reference voltage indicating the rotational speed of the rotor in the motor. The reference voltage preferably comprises an analog signal having a magnitude which increases linearly with increases in the rotor speed. Alternatively, the reference voltage may comprise any other type of signal, such as a digital signal or sequence of electrical pulses, which indicates the speed of the rotor.

A controller 46 energizes motor 40 with an electrical current via a line 48. Controller 46 is also connected to tachometer 44 via a line 50 for receiving the reference voltage. Controller 46 includes a memory 52 programmed with a table of data for relating a given reference voltage from tachometer 44 to a rotational speed of crucible 34. Memory 52 may also includes data for programming a desired rotational speed and ramping values for the crucible as well as other operational data. Controller 46 employs a conventional closed loop control system via lines 48 and 50 for energizing motor 40 to rotate crucible 34 at the desired speed.

Controller 46 is also connected to motor 33 via electrical lines (not shown) and thereby controls the rotation of plate 30, crystal lifting mechanism 28 and crystal rod 58. Controller 46 also energizes the motor which powers crystal lifting mechanism 28 via electrical lines (not shown). Controller 46 thereby controls the rate at which pull wire 26 is drawn into the crystal lifting mechanism which is the rate at which crystal rod 58 is pulled from the silicon melt M.

The crystal growing process begins with a seed crystal 54 held at the lower end of pull wire 26 via a seed chuck 56. Crucible 36 and seed crystal 54 are rotated in opposite directions as the seed crystal is lowered into contact with silicon melt M. After the end of the seed is melted, silicon melt M is cooled until the crystal begins to grow. Crucible 36 is rotated in the opposite direction of seed crystal 54 as the seed crystal is pulled from the melt. As seed crystal 54 grows, it solidifies silicon from silicon melt M to form single crystal silicon rod 58.

In practice, the "Crystal Growing System", Model No. CZ150, sold by Ferrofluidics Corp., 40 Simon Street, Nashua, N.H. 03061 is a suitable crystal pulling machine for practicing the present invention. The Ferrofluidics System includes an Electro-Craft Motomatic® Series E-652 motor for rotating the crucible. The control cards supplied by Ferrofluidics for controlling the motor to control rotation of the crucible allow the crucible speed to be ramped up/down and switched on/off; however, additional programming consistent with the disclosure below is required to practice the invention.

Figure 2:
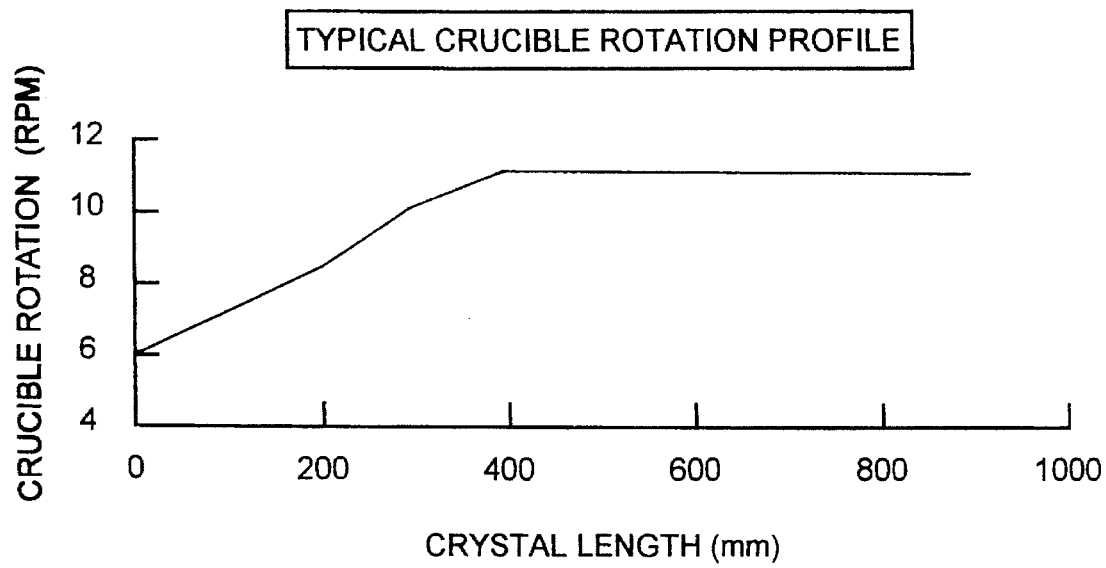
FIG. 2 shows a prior art crucible rotation profile.
Figure 3:
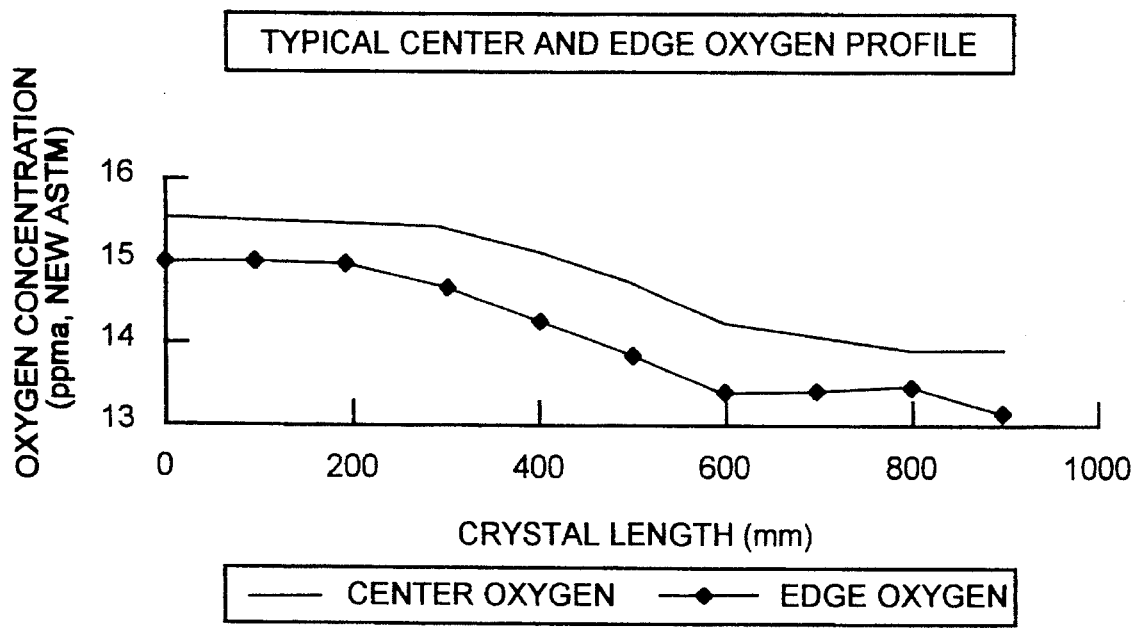
FIG. 3 shows the oxygen profile for a crystal rod pulled using the crucible rotation profile shown in FIG. 2.

FIG. 2 shows a prior art rotational profile for ramping a crucible such as crucible 34 from a rotational speed of six rpm when the pull begins up to a top speed of eleven rpm for the duration of the pull from 400 to 900 mm. FIG. 3 shows the typical center and edge oxygen profile for a silicon crystal rod pulled with the profile of FIG. 2. A primary problem with the oxygen profile shown in FIG. 3 is that the oxygen content in the silicon rod decreases substantially from 300 mm to 900 mm. This axial oxygen gradient means that silicon wafers sliced from the front end of the rod will have different electrical properties than wafers sliced from the back end of the rod. There is also a radial oxygen gradient between the center and edge of the silicon rod which causes the electrical properties of the middle of a silicon wafer to vary from the silicon near the edge of the same wafer. Such product inhomogeneity caused by oxygen gradients is undesirable for manufacturers of integrated circuits.

Figure 4:
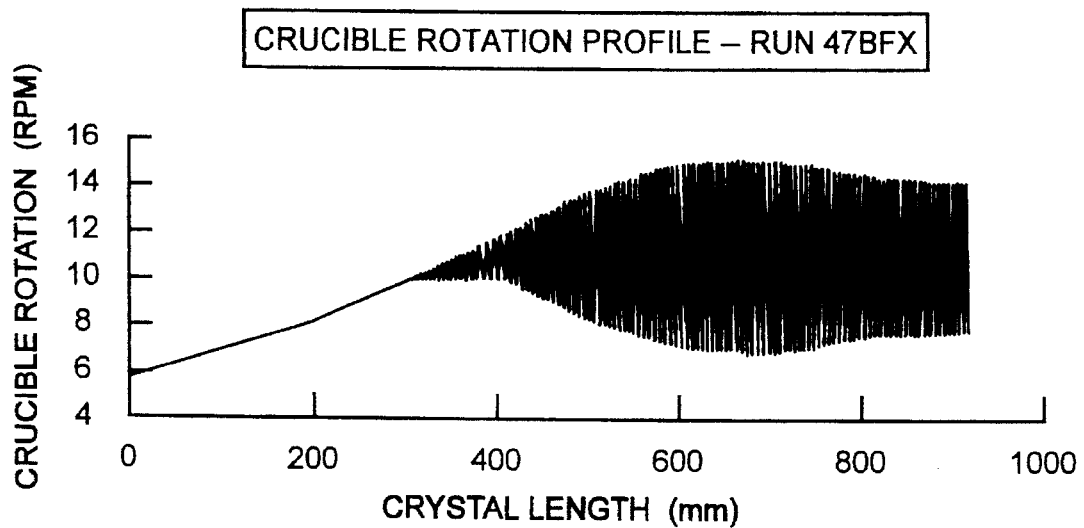
FIG. 4 shows a crucible rotation profile of the present invention.

FIG. 4 shows a novel rotational profile for crucible 34 which substantially solves the problem of axial oxygen gradients. The radial oxygen gradient can also be reduced to acceptable levels.

As shown in FIG. 4, the rotational speed of crucible 34 is ramped from an initial speed of about six rpm at the beginning of the pull to a mean speed or reference speed of about eleven rpm after the crystal rod has been pulled 400 mm. The mean speed is then maintained at about eleven rpm for the remainder of the pull. Further, beginning at about 300 mm of pull, an oscillatory rotational profile having a period of about 15 seconds is added to the mean speed. The oscillatory profile preferably has the shape of a sine wave and causes the rotational speed of the crucible to increase and decrease as a function of the value of the sine wave. Because a sine wave is symmetric about the X-axis, the average rotational speed of the crucible remains the same, even after addition of this oscillatory profile to the mean speed profile. Because the amplitude of the sign wave is less than the mean speed profile, crucible 34 is seen to rotate unidirectionally at a variable speed.

In practice, the crucible rotational profile shown in FIG. 4 can be implemented with the hardware shown in FIG. 1. In particular, controller 46 includes a set point for setting the speed of rotation of motor 40 and, hence, of crucible 34. When the voltage applied to the set point is increased, controller 46 increases the speed of motor 40. Likewise, when the voltage applied to the set point is decreased, controller 46 decreases the speed of motor 40. By comparing the voltage applied to the set point against the reference voltage output by tachometer 44, controller 46 is able to adjust the speed of motor 40 to coincide with the speed indicated by the voltage applied to the set point in a conventional closed loop control system.

Controller 46 is connected to a signal generator 60 via a line 62. Signal generator 60 generates an oscillatory profile for setting the rotational speed of crucible 34. The oscillatory profile may take the form of a digital signal having data points which fall along a sine wave. Alternatively, the signal generator may comprise an analog signal generator for generating the oscillatory profile in the form of an analog sine wave. Signal generator 60 also generates a mean speed profile such as the mean speed profile shown in FIG. 4. Signal generator 60 then sums the oscillatory profile with the mean speed profile to generate a speed signal which is applied to the set point of controller 46 for controlling the speed of motor 40. Those skilled in the art will recognize that other conventional methods for producing a speed signal having the profile shown in FIG. 4 may also be used within the scope of the invention.

The speed signal preferably has the general shape of the rotational profile shown in FIG. 4. In the simplified case where each one volt increment applied by signal generator 60 to the set point of controller 46 causes a one rpm increase in crucible rotational speed, the speed signal for producing the rotational profile of FIG. 4 will simply be a voltage signal having a voltage which follows the vertical scale in FIG. 4 (but measured in volts instead of rpm). For example, from the beginning of the pull until about 300 mm, the speed signal will be a ramped voltage from about 6 volts to about 10 volts. From about 300 mm to about 400 mm, the speed signal will be the sum of a ramped voltage from about 10 volts to about 11 volts and a sinusoidal voltage having a period of about 15 seconds and an amplitude (measured from ground voltage) ramped from 0 at about 300 mm to about 1 volt at about 400 mm. From about 400 mm to the end, the speed signal will be the sum of a substantially dc voltage of about 11 volts and a sinusoidal voltage having a period of about 15 seconds and an amplitude (measured from ground voltage) ramped according to the contour shown in FIG. 4. Those skilled in the art will recognize that the voltage of the speed signal can be scaled appropriately for other ratios of speed signal voltage to crucible rotational speed.

When the oscillatory profile of the speed signal takes the form of a sine wave, it is seen that the speed signal has a continuously varying magnitude which causes crucible 34 to rotate at a continuously varying acceleration and continuously varying rotational speed. Because a sine wave is inherently smooth and periodic, it is also seen that the speed signal has a plurality of periods during which it monotonically increases and decreases. This causes crucible 34 to rotate at a rotational speed which monotonically increases and decreases as a function of the speed signal while at least a portion of the crystal rod is being pulled.

Figure 5:
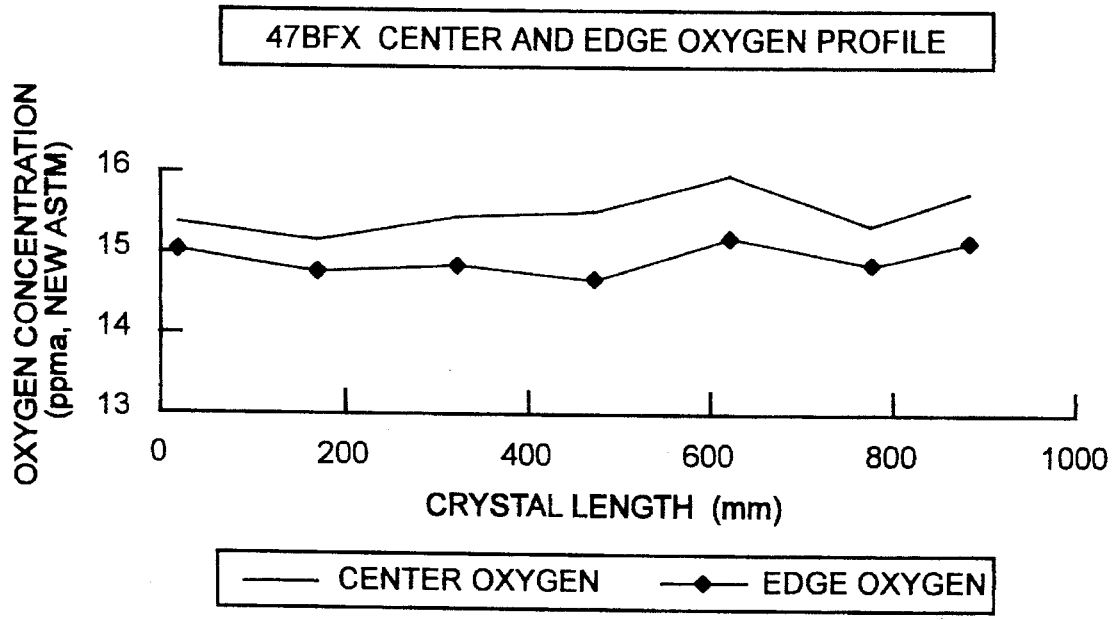
FIG. 5 shows the oxygen profile for a crystal rod pulled using the crucible rotation profile shown in FIG. 4.

FIG. 5 shows the center and edge oxygen profile of a silicon crystal rod pulled with the crucible rotational profile shown in FIG. 4 and using a 22 inch diameter crucible. As seen, the axial and radial oxygen gradients are reduced and provide a desirable silicon crystal rod.

The theory of operation for the crucible rotational profile shown in FIG. 4 is that the rapid change in acceleration and speed of the crucible caused by the oscillatory profile decreases the oxygen diffusion boundary layer thickness in the silicon melt near the crucible wall. This enriches the silicon melt with oxygen and increases the oxygen concentration in the growing crystal through segregation at the silicon solid-liquid interface. Accordingly, the oscillatory profile is added to the speed signal during portions of the pull where the oxygen concentration in the rod is low. Because the oxygen concentration is highest during the initial portion of the pull when the crucible rotation is being ramped up from the initial rpm, there is no need for increasing the oxygen concentration and so the oscillatory profile is not added to the speed signal. Following the early portion of the pull, however, the oxygen concentration begins to tail off so the oscillatory profile is slowly phased in to increase the oxygen concentration and substantially reduce the axial oxygen gradient as seen in FIG. 5.

As a matter of design, it is preferable to design the mean speed profile first because it largely determines the radial oxygen gradient in the pulled crystal. Once the mean speed profile has been maximized within an acceptable radial oxygen gradient, the oscillatory profile is fine tuned to minimize the axial oxygen gradient. As a general rule, increasing the average crucible rotational speed, i.e. the mean speed profile, with no sinusoidal amplitude fluctuations increases the radial oxygen gradient. Further, increasing the amplitude of sinusoidal rotation, i.e. the oscillatory profile, without increasing the average crucible rotational speed increases the oxygen concentration along the central axis and the outer radius which improves the radial oxygen gradient and, if implemented during the later portion of the pull, substantially reduces the axial oxygen gradient.

Overall, the average rotational speed of the crucible set by the mean speed profile for any given moment of operation should fall with the range of from about 1 rpm to about 20 rpm. The maximum amplitude of the increase in rotational speed set by the oscillatory profile for any given moment of operation should fall within the range of from about 0 rpm to about 12 rpm. In any event, the amplitude of the oscillatory decrease in rotational speed set by the oscillatory profile should not exceed the then existing average rotational speed set by the mean speed profile so that the crucible is always rotating in the same direction, albeit at variable speeds.

As a further matter of design, low oxygen crystal rods should generally be pulled with a low amplitude oscillatory profile and high oxygen crystal rods should generally be pulled with a large amplitude oscillatory profile. The frequency of modulation must be sufficiently high to prevent both thermal and mechanical fluctuations at the melt level which could affect the growing seed or crystal. A period of oscillation of about 15 seconds to about one minute has been found preferable for a crucible having a diameter of 22 inches.

In practice, it has been found preferable to set the mean speed profile of the speed signal so that the average rotational speed of the crucible increases after a diameter of the crystal rod has been established until the rod has been pulled to a range of about twenty to about fifty percent of its final pull length. Thereabout, the crucible is preferably rotated at a continuously varying acceleration and continuously varying rotational speed until the rod has been pulled to within at least about twenty percent of its final pull length. The crystal rod pulled using the continuously varying speed signal may be pulled with a lower mean rotational speed of the crucible and has a lower oxygen gradient and higher oxygen concentration than a crystal rod pulled without using a speed signal which continuously varies. Alternatively, the crucible may be variably rotated following the initial portion of the pull during a plurality of periods wherein the rotational speed of the crucible monotonically increases and decreases during the periods until the rod has been pulled to within at least about twenty percent of its final pull length. The crystal rod pulled using such monotonic periods may be pulled with a lower mean rotational speed of the crucible and has a lower oxygen gradient and higher oxygen concentration than a crystal rod pulled without using a periodic monotonically increasing and decreasing signal.

As still another alternative, it has also been found preferable to set the mean speed profile of the speed signal so that the average rotational speed of the crucible increases after a diameter of the crystal rod has been established until the rod has been pulled to a range of about twenty to about fifty percent of its final pull length and whereafter the rotational speed of the crucible reaches a reference speed. Thereabout, the rotational speed of the crucible is preferably increased and decreased above and below the reference speed until the rod has been pulled to within at least about twenty percent of its final pull length. The crystal rod pulled using such a variable crucible speed swinging about the reference speed may be pulled with a lower mean rotational speed of the crucible and has a lower oxygen gradient and higher oxygen concentration than a crystal rod pulled without using such a variable speed crucible.

In each of the three alternatives above, there may be some overlap between the operation where the mean speed profile is increasing the average rotational speed of the crucible and the operation where the oscillatory profile begins oscillating the instantaneous speed of the crucible about the true average rotational speed. This overlap is shown in the profile of FIG. 4. The amount of overlap may be increased where the oscillatory profile begins at a low amplitude and slowly ramps up to higher amplitudes during the later portion of the pull. For example, starting the pull of the body of the crystal with an initial crucible rotation of 6 rpm, an amplitude of oscillation of 0.3 rpm, and a crucible rotation cycle period of 31 secs., the following ramping values may be used based on the length of the pull:

| Crystal Length | Crucible Ramp | Amplitude Ramp |
|---|---|---|
| 100 | 0 | 0.004 |
| 200 | 0 | 0.004 |
| 300 | 0.024 | 0.004 |
| 400 | 0.006 | 0.010 |
| 500 | 0 | 0.007 |
| 600 | 0 | 0.001 |
| 700 | 0 | 0.007 |
| 800 | 0 | 0.004 |
| 900 | 0 | −0.001 |
| 1000 | 0 | −0.004 |

The data in the above table may be used in conjunction with a target seed rotation of 19 rpm at the start of the body of the crystal rod. The seed rotation may be operated in a range of about 17 to about 19 rpm for a 200 mm diameter crystal rod to prevent large facet growth and melt swirling. A crucible having a 22 inch diameter may also be used. With this combination of operating conditions, axial and radial oxygen gradients of less than 6% can be achieved.

Some publications teach the use of pulsed square waves or triangular waves for rotating a crucible in growing crystals. A problem with these waveforms is that their "corners" create undue mechanical shock and stress on the drive train for the crucible. This causes a loss of energy and accelerates the wear rate of the drivetrain.

One method for converting from such pulsed or triangular waveforms to driving the crucible with a sinusoidal waveform is through Fourier analysis. By approximating the pulsed or triangular waveform by the fundamental frequency of the Fourier expansion, the higher order components are removed and the drive signal for the crucible motor comprises a sine wave. This reduces the mechanical shock and wear on the drivetrain.

For example, for a pulsed square wave shown in a publication or otherwise known as having a peak amplitude of "A" (measured from zero for a total swing of 2A) starting at t=0, and a half-period of "a," the Fourier expansion follows:

$$\Im\{g(t)\} = (4A/\pi) \sum_{n=1}^{\infty} (1/n)\sin(n\pi t/a) \quad [1]$$
$$\text{for } n = 1,3,5,7 \ldots \infty$$

Accordingly, to simulate the crystal growth which occurs with this pulsed square wave but using a sine wave, the oscillatory profile of the speed signal should be set up with the fundamental frequency of equation [1] and have a peak amplitude $4/\pi$ times greater than the peak amplitude of the pulsed square wave. It is noted that the duty cycle and frequency of the pulsed square wave and fundamental frequency are about the same in many cases.

Likewise, for a triangular wave shown in a publication or otherwise known as having a half-period of "a," and a peak amplitude of "A" (measured from zero for a total swing of 2A) at t=a/2, the Fourier expansion follows:

$$\Im\{g(t)\} = (8A/\pi^2) \sum_{n=0}^{\infty} (-1)^n / (2n+1)^2 \sin[(2n+1)\pi t/a] \quad [2]$$

Accordingly, to simulate the crystal growth which occurs with this triangular wave but using a sine wave, the oscillatory profile of the speed signal should be set up with the fundamental frequency of equation [2] and have a peak amplitude $8/\pi^2$ times less than the peak amplitude of the triangular wave. It is noted that the duty cycle and frequency of the triangular wave and fundamental frequency are about the same in many cases.

It will be recognized that a fundamental Fourier frequency can be determined for any periodic signal used to drive a crucible, particularly a periodic signal used for varying the rotational speed of the crucible to achieve a desired oxygen concentration and gradient in a pulled semiconductor crystal. The steps are to perform a Fourier analysis on the periodic signal; generate a sine wave which corresponds to a fundamental Fourier frequency of the periodic signal; energize the crucible motor to rotate the crucible at a rotational speed which increases and decreases as a function of the generated sine wave; and pull at least a portion of the semiconductor crystal as the crucible rotates in response to the energizing step.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. An apparatus for pulling a semiconductor crystal according to a Czochralski method, the apparatus comprising:

a crucible containing a melt;

a crystal pulling mechanism for pulling the semiconductor crystal from the melt in the crucible;

a motor coupled to the crucible;

a signal generator for generating a continuously varying speed signal; and a control circuit connected to the motor receiving and responsive to the continuously varying speed signal generated by the signal generator for energizing the motor, said control circuit energizing the motor to rotate the crucible at a continuously varying acceleration and continuously varying rotational speed as a function of the continuously varying speed signal while the crystal pulling mechanism is pulling at least a portion of the semiconductor crystal from the melt in the crucible.

2. The apparatus of claim 1 wherein the continuously varying speed signal comprises a sine wave.

3. The apparatus of claim 2 wherein the Czochralski method employs a pulsed square wave for varying a rotational speed of a crucible to achieve a desired oxygen concentration in a pulled semiconductor crystal and wherein the sine wave generated by the signal generator has an amplitude greater than an amplitude of the pulsed square wave by a factor of about four divided by $\pi$ and the control circuit is responsive to the sine wave for energizing the motor so that the speed at which the crucible is rotated has an oscillatory profile corresponding to the amplitude of the sine wave, whereby the desired oxygen concentration in the pulled semiconductor crystal is achieved with reduced mechanical shock on the motor relative to the mechanical shock on the motor when operating in response to the pulsed square wave.

4. The apparatus of claim 1 wherein the continuously varying speed signal comprises a plurality of data points which fall along a sine wave.

5. The apparatus of claim 4 wherein the Czochralski method employs a pulsed square wave for varying a rotational speed of a crucible to achieve a desired oxygen concentration in a pulled semiconductor crystal and wherein the sine wave along which the plurality of data points of the continuously varying speed signal generated by the signal generator fall has an amplitude greater than an amplitude of the pulsed square wave by a factor of about four divided by $\pi$ and the control circuit is responsive to the plurality of data points for energizing the motor so that the speed at which the crucible is rotated has an oscillatory profile corresponding to the amplitude of the continuously varying speed signal, whereby the desired oxygen concentration in the pulled semiconductor crystal is achieved with reduced mechanical shock on the motor relative to the mechanical shock on the motor when operating in response to the pulsed square wave.

6. The apparatus of claim 5 wherein the motor unidirectionally rotates the crucible at a variable speed.

7. The apparatus of claim 1 wherein the motor comprises a tachometer for producing a reference voltage corresponding to a rotational speed of a rotor in the motor and wherein the control circuit comprises a closed loop control system connected to the tachometer for energizing the motor as a function of the reference voltage produced by the tachometer and of the continuously varying speed signal.

8. The apparatus of claim 1 wherein the motor unidirectionally rotates the crucible at a variable speed.

9. An apparatus for pulling a semiconductor crystal according to a Czochralski method, the apparatus comprising:

a crucible containing a melt;

a crystal pulling mechanism for pulling the semiconductor crystal from the melt in the crucible;

a motor coupled to the crucible;

a signal generator for generating a speed signal having a plurality of periods and which monotonically increases and decreases during each period; and a control circuit connected to the motor receiving and responsive to the monotonically increasing and decreasing speed signal generated by the signal generator for energizing the motor, said control circuit energizing the motor to rotate the crucible at a rotational speed which monotonically increases and decreases as a function of the speed signal while the crystal pulling mechanism is pulling at least a portion of the semiconductor crystal from the melt in the crucible.

10. The apparatus of claim 9 wherein the speed signal comprises a sine wave.

11. The apparatus of claim 10 wherein the Czochralski method employs a pulsed square wave for varying a rotational speed of a crucible to achieve a desired oxygen concentration in a pulled semiconductor crystal and wherein the sine wave generated by the signal generator has an amplitude greater than an amplitude of the pulsed square wave by a factor of about four divided by $\pi$ and the control circuit is responsive to the sine wave for energizing the motor so that the speed at which the crucible is rotated has an oscillatory profile corresponding to the amplitude of the sine wave, whereby the desired oxygen concentration in the pulled semiconductor crystal is achieved with reduced mechanical shock on the motor relative to the mechanical shock on the motor when operating in response to the pulsed square wave.

12. The apparatus of claim 9 wherein the speed signal comprises a plurality of data points which fall along a sine wave.

13. The apparatus of claim 12 wherein the Czochralski method employs a pulsed square wave for varying a rotational speed of a crucible to achieve a desired oxygen concentration in a pulled semiconductor crystal and wherein the sine wave along which the plurality of data points of the speed signal generated by the signal generator fall has an amplitude greater than an amplitude of the pulsed square wave by a factor of about four divided by $\pi$ and the control circuit is responsive to the plurality of data points for energizing the motor so that the speed at which the crucible is rotated has an oscillatory profile corresponding to the amplitude of the speed signal, whereby the desired oxygen concentration in the pulled semiconductor crystal is achieved with reduced mechanical shock on the motor relative to the mechanical shock on the motor when operating in response to the pulsed square wave.

14. The apparatus of claim 9 wherein the motor comprises a tachometer for producing a reference voltage corresponding to a rotational speed of a rotor in the motor and wherein the control circuit comprises a closed loop control system connected to the tachometer for energizing the motor as a function of the reference voltage produced by the tachometer and of the speed signal.

15. The apparatus of claim 9 wherein the motor unidirectionally rotates the crucible at a variable speed.

* * * * *